United States Patent
Horn et al.

(10) Patent No.: US 7,919,804 B2
(45) Date of Patent: Apr. 5, 2011

(54) POWER DISTRIBUTION FOR HIGH-SPEED INTEGRATED CIRCUITS

(75) Inventors: Kevin Horn, Brighton, CO (US); Forest Dillinger, Golden, CO (US); Otto Richard Buhler, Boulder, CO (US); Karl Sauter, Pleasanton, CA (US)

(73) Assignee: Oracle America, Inc., Redwood City, CA (US)

( * ) Notice: Subject to any disclaimer, the term of this patent is extended or adjusted under 35 U.S.C. 154(b) by 122 days.

(21) Appl. No.: 11/565,818

(22) Filed: Dec. 1, 2006

(65) Prior Publication Data

US 2007/0102806 A1    May 10, 2007

Related U.S. Application Data

(63) Continuation-in-part of application No. 11/269,348, filed on Nov. 8, 2005, now abandoned.

(51) Int. Cl.
*H01L 21/70* (2006.01)

(52) U.S. Cl. ............... 257/310; 257/528; 257/E29.015; 257/501; 361/313; 361/762; 361/734

(58) Field of Classification Search .................. 257/301, 257/700, 698, 310, 501, 528; 174/260
See application file for complete search history.

(56) References Cited

U.S. PATENT DOCUMENTS

| | | | |
|---|---|---|---|
| 5,162,977 A | 11/1992 | Paurus et al. | |
| 5,261,153 A | 11/1993 | Lucas | |
| 5,273,439 A | 12/1993 | Szerlip et al. | |
| 5,274,584 A | 12/1993 | Henderson et al. | |
| 5,428,499 A | 6/1995 | Szerlip et al. | |
| 5,448,511 A | 9/1995 | Paurus et al. | |
| 5,469,324 A | 11/1995 | Henderson et al. | |
| 5,504,993 A | 4/1996 | Szerlip et al. | |
| 5,800,575 A | 9/1998 | Lucas | |
| 5,853,889 A | 12/1998 | Joshi et al. | |
| 5,874,516 A | 2/1999 | Burgoyne, Jr. et al. | |
| 6,118,671 A | 9/2000 | Tanei et al. | |
| 6,280,794 B1 | 8/2001 | Tu et al. | |
| 6,349,456 B1 * | 2/2002 | Dunn et al. | ........... 29/25.42 |
| 6,777,320 B1 | 8/2004 | Chiang et al. | |
| 6,847,527 B2 * | 1/2005 | Sylvester et al. | ............ 361/763 |
| 6,888,218 B2 | 5/2005 | Kling et al. | |
| 6,967,138 B2 | 11/2005 | Ding | |
| 7,183,651 B1 | 2/2007 | Buhler et al. | |
| 7,232,874 B2 | 6/2007 | Aoi | |
| 7,233,061 B1 | 6/2007 | Conn | |
| 7,365,395 B2 | 4/2008 | Stumbo et al. | |
| 2002/0180063 A1 * | 12/2002 | Iwaki et al. | ................... 257/778 |
| 2006/0044734 A1 * | 3/2006 | Ahn et al. | ...................... 361/313 |
| 2006/0133057 A1 * | 6/2006 | McGregor et al. | ............ 361/763 |
| 2007/0100109 A1 | 5/2007 | Hacker et al. | |

* cited by examiner

*Primary Examiner* — Marcos D. Pizarro
*Assistant Examiner* — Eva Yan Montalvo
(74) *Attorney, Agent, or Firm* — Brooks Kushman P.C.

(57) ABSTRACT

An improved technique for power distribution for use by high speed integrated circuit devices. A mixture of high dielectric constant, Er and low Er materials are used in a dielectric layer sandwiched between the voltage and ground planes of a printed circuit board that is used to fixture one or more integrated circuit devices. The low Er material is used in an area contained by the location of the integrated circuit device and its corresponding decoupling capacitors located nearby. High Er material is used in areas between the regions of low Er material. The low Er material improves that speed at which current from an adjoining decoupling capacitor can propagate to a power pin of the integrated circuit device. The high Er material mitigates cross-coupling of noise between the low Er regions.

14 Claims, 3 Drawing Sheets

POWER DISTRIBUTION FOR HIGH-SPEED INTEGRATED CIRCUITS

CROSS-REFERENCE TO RELATED APPLICATIONS

This application is a continuation-in-part of U.S. application Ser. No. 11/269,348 filed Nov. 5, 2005, the disclosure of which is hereby incorporated in its entirety.

BACKGROUND OF THE INVENTION

1. Field of the Invention

The present invention relates generally to techniques for improving power distribution for electrical and electronic devices, and more particularly relates to techniques for distributing power for use by high speed integrated circuit devices.

2. Background Art

As frequencies in high speed electronic devices increase, it becomes more challenging to provide effective power supply decoupling. Integrated circuit devices (ICs) require high frequency current for their operation. The current requirements for such IC devices must be identified to properly assess the decoupling and power distribution requirements.

High speed ICs are typically mounted on printed circuit boards (PCBs). Sufficient current must be distributed to the devices within required switching times, while maintaining a relatively constant input supply voltage. To achieve this, discrete capacitors are often placed near the devices. These capacitors are connected between the voltage and ground planes of a carrier such as a printed circuit board to provide the necessary charge current to the devices. Decoupling capacitors release charge to the device at a rate that is proportional to the device's switching frequency. As device switching frequency increases, the window of time between switching events decreases. For this reason, the circuit designer must minimize the distance or time that it takes the charge to travel between the decoupling capacitor and the device. This is accomplished by placing decoupling capacitors as close to the device power pins as possible. Decoupling capacitors must recharge from energy stored in slower discharging capacitors and power supplies prior to the next required discharge. At high frequencies, power-ground planes, ceramic decoupling capacitors and bulk decoupling capacitors are often used in combination.

For the circuit designer, providing high speed devices with adequate current in the time required becomes more challenging as switching speeds increase. This is usually accomplished by mounting the capacitors on the opposite side of the board, next to the vias which connect to the device power pins. There are several circumstances, however, that eliminate this option. For example, ball grid array (BGA) devices have ever-increasing pin-counts and decreasing ball pitches. This combination translates into very dense via fields on the underside of the card, leaving little or no room for decoupling capacitors. Consequently, too few capacitors are used to provide adequate current to all the power pins or the capacitors are placed too far away from the power pins to effectively provide current to the device. Another situation that eliminates the possibility of mounting decoupling capacitors on the opposite side of the card is when blind vias are used to connect the device to power and ground planes. Since blind vias do not penetrate all the way through the board, there are no vias on the other side to pair up with decoupling capacitors. In this situation, the designer is forced to place the decoupling capacitors around the perimeter of the part on the same side of the board. The distance between power pin and capacitor is further increased by a manufacturing keep-out area, which prevents the designer from placing capacitors adjacent to the device in order to provide a physical space or area for re-work.

These examples demonstrate the physical constraints that increase the distance a charge must propagate between a decoupling capacitor and an associated IC power pin. However, the material structure of the PCB determines the velocity at which charge propagates between a decoupling capacitor and an associated IC power pin. The velocity of propagation, Vp, is defined as the speed of light, c, divided by the square root of the dielectric constant, Er.

$$v_p = \frac{c}{\sqrt{\varepsilon_r}}$$

As Er is reduced, the velocity of propagation increases. Therefore, if the dielectric constant of the core material between power and ground layers of the PCB is minimized, the time required for charge to propagate from decoupling capacitors to power pins will be minimized. Thus, decoupling capacitors can be further away from the IC and still provide effective decoupling. However, there is a price for achieving higher propagation velocities. As the dielectric constant of the material between power and ground planes is decreased, the effective radius from which a given power pin is able to draw current is increased. In other words, electrical perturbations generated by IC switching are able to propagate further distances on the PCB. Consequently, decoupling capacitors meant to provide power to one IC may also provide power to several other nearby ICs. This overlap in decoupling regions results in higher noise levels in the power being provided to each IC. A new PCB structure is needed that will enable current to reach ICs in shorter time periods, while isolating high-speed switching noise to individual IC decoupling regions

BRIEF DESCRIPTION OF THE DRAWINGS

The present invention is pointed out with particularity in the appended claims. However, other features of the present invention will become more apparent and the present invention will be best understood by referring to the following detailed description in conjunction with the accompany drawings in which:

DETAILED DESCRIPTION OF THE PREFERRED EMBODIMENT(S)

Figure 1:
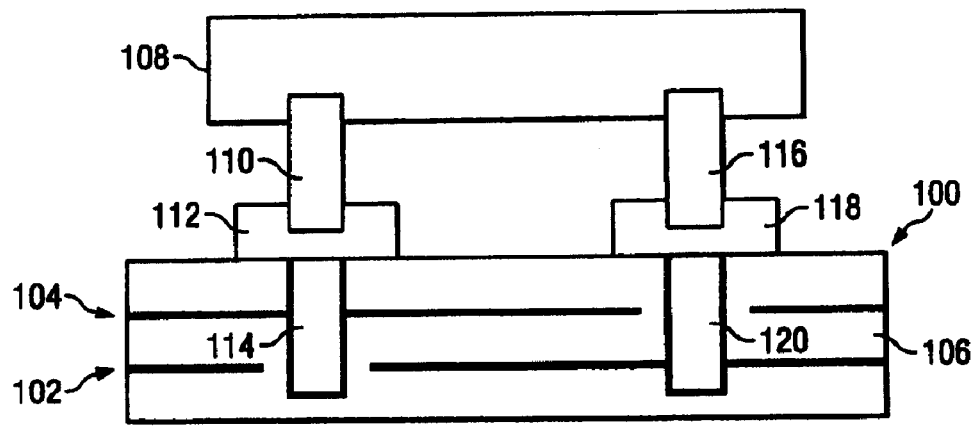
FIG. 1 depicts a traditional printed circuit board with attached integrated circuit device and internal power planes.

FIG. 1 shows a typical power-ground plane construction according to the prior art, shown in the context of printed circuit board (PCB) 100 and device 108 (such as an integrated circuit) mounted thereon. In this example, the PCB 100 is composed of two internal planes 102, 104, for example, within a printed circuit board. One plane 102 is a ground plane or layer, while plane 104 is voltage plane or layer. Sandwiched between planes 102 and 104 is a dielectric layer 106. These internal layers create a buried capacitance structure used for decoupling of integrated circuit (IC) device 108 that is attached to printed circuit board 100. In this example, IC device 108 has a connection 110 by way of solder pad 112 and via 114 to power plane 104, and another connection 116 by way of solder pad 118 and via 120 to ground plane 102. In typical prior art structures, ground and power planes 102, 104 are formed of a conductor material such as copper, and dielectric layer 106 is composed of a material having a high dielectric constant. This high dielectric constant material was desired in order to maximize the resulting effective capacitance of the resulting structure.

Figure 2:
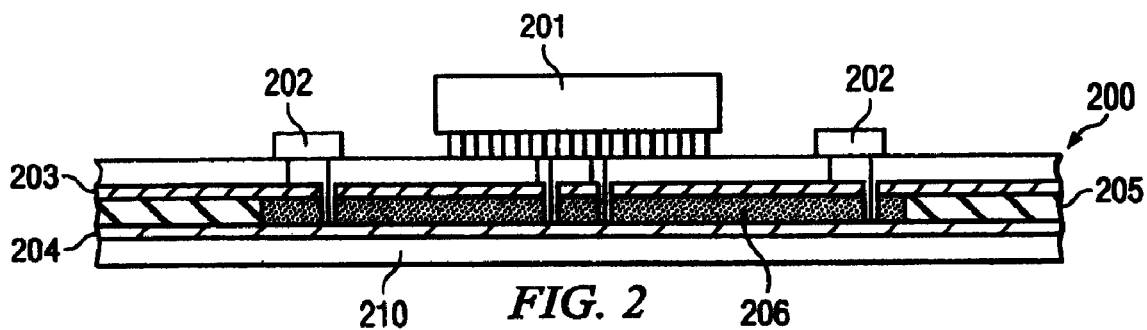
FIG. 2 depicts a side view of a new printed circuit board structure per the present invention.

FIG. 2 shows a PCB structure that maximizes the velocity of charge propagation from discrete decoupling capacitors to power pins of an IC device, while isolating the IC's power decoupling region from other PCB IC devices. PCB 200 is composed of copper planes 203 and 204, with copper plane 204 being attached to underlying substrate 210, which is typically fiberglass but could also be a flexible substrate material. One plane 203 is a voltage plane, while the other plane 204 is a ground plane. Sandwiched between planes 203 and 204 is a dielectric layer composed of material with varying dielectric constant, Er. In this example, two dielectric materials 205 and 206 are used in the dielectric layer. Dielectric material 205 has a relatively high Er (K>3, and preferably >=7), while dielectric material 206 has a relatively low Er (K is preferably between 1.0 and 3.0). The actual dielectric numbers themselves are not necessarily critical—but rather the fact that there is a differential in dielectric constants with respect to at least two dielectric materials in a given dielectric layer, and preferably this dielectric differential (high Er–low Er) between two intra-layer materials is greater than or equal to 1. Dielectric material 206 provides a high-speed path for current to propagate between IC device 201 and decoupling capacitors 202. Dielectric material 205 provides a low-speed path for power supply currents and bulk decoupling currents to propagate. Dielectric material 205 damps perturbations once they have propagated outside dielectric region 206. In effect, dielectric material 205 shrinks the radial area that "sees" perturbations generated by device 201.

Figure 3:
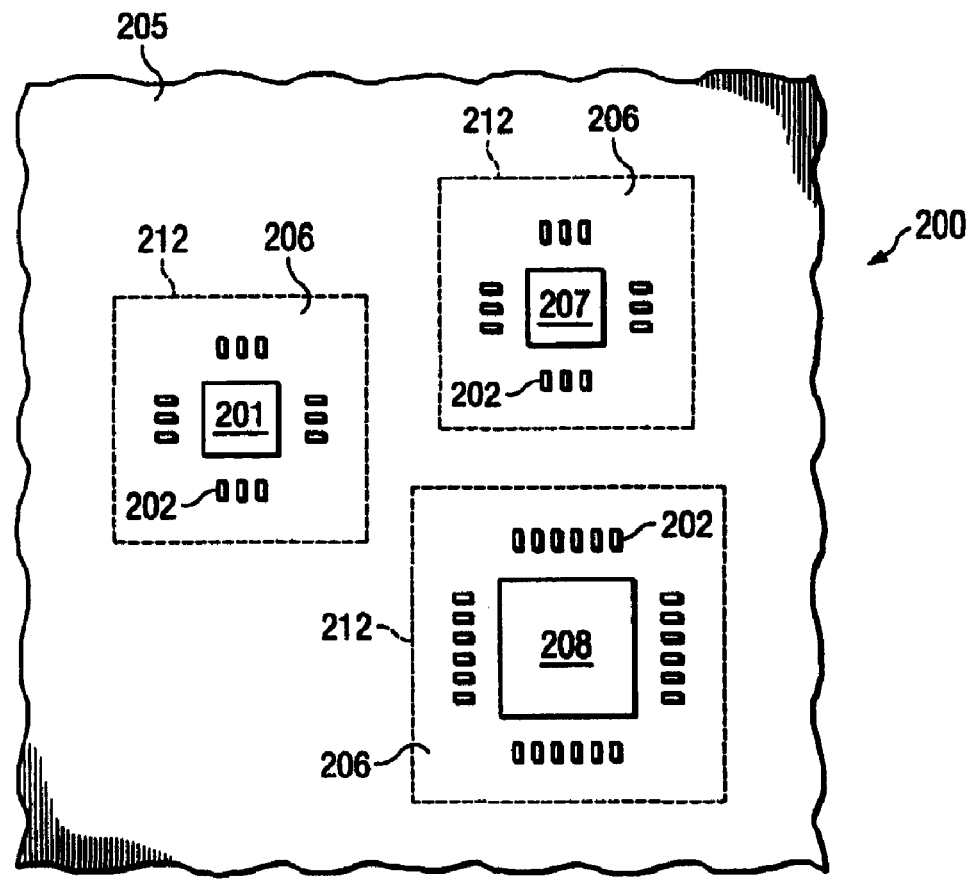
FIG. 3 depicts a top view of a new printed circuit board structure per the present invention.

FIG. 3 shows a top-view of the new PCB structure 200. IC devices 201, 207, 208, along with their respective decoupling capacitors 202, typically ceramic capacitors having capacitance values of 0.01 uF-0.1 uF, are mounted to the PCB over internal dielectric material 206, the dielectric material 206 having a low Er. The material surrounding dielectric 206 is high Er material 205. In effect, the PCB dielectric layer is composed of discrete patches of low dielectric constant material located beneath the areas contained by IC devices and their dedicated decoupling capacitors, and these patches are encompassed or surrounded in a lateral direction by a high dielectric constant material. The low Er patches are underneath the IC devices and their dedicated decoupling capacitors in order to provide a high speed propagation path, whereas the high Er material encompasses, envelopes or surrounds these low dielectric patches in order to dampen or partially-isolate these high speed paths from the other IC devices and their corresponding decoupling capacitors. As used herein, the IC decoupling region is defined to be a region within the printed circuit board that is underneath (at least partially or totally) an integrated circuit device that is attached to the surface of the printed circuit board, and further includes an adjoining region that is underneath at least one IC decoupling capacitor adjacent to its associated IC device. Representative IC decoupling regions are shown by dotted lines at 212 in FIG. 3. In effect, the integrated circuit device and its associated decoupling capacitors define a footprint on the surface of the printed circuit board, and the regions of low Er material are underneath these footprints.

Figure 4:
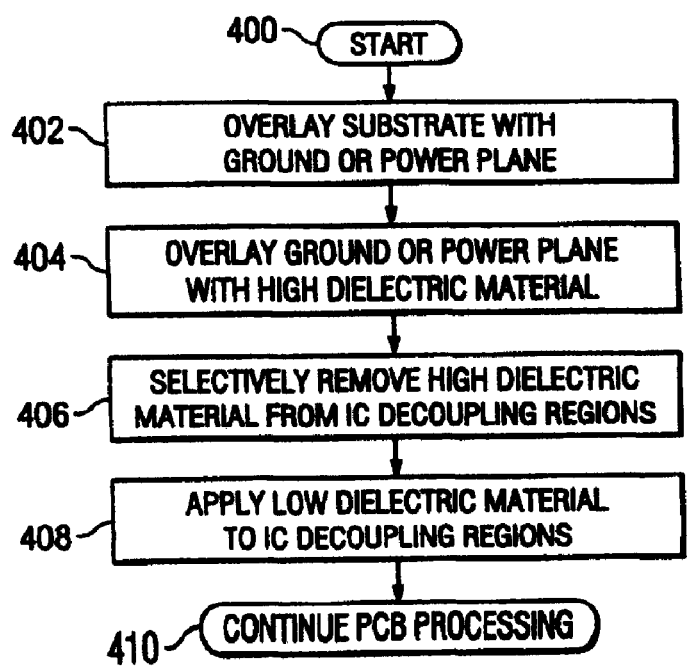
FIG. 4 depicts a partial process for manufacturing a printed circuit board in accordance with the present invention.

In the preferred embodiment, during manufacturing of the printed circuit board as shown starting at 400 in FIG. 4, a substrate material such as 210 of FIG. 2 is overlaid or coated at 402 with a conductive layer such as ground plane 204 of FIG. 2. This ground plane 204 is then overlaid or coated at 404 with a material having a high dielectric constant. A representative high dielectric constant material is tantalum oxide or aluminum oxide. Other types of high dielectric constant materials are ceramics such as alumina, glasses such as borosilicate, and mica. This sheet or layer of high dielectric constant material is then etched or otherwise processed to remove the high dielectric material from the IC decoupling regions at 406. Alternatively, the high dielectric sheet could be stenciled to accommodate the IC decoupling regions prior to being attached to the power plane 204. Or, the conductive plane could be masked appropriately prior to forming the high dielectric constant layer over the conductive plane. A low dielectric material is then applied within the IC decoupling regions at 408, thereby forming a composite, co-planar dielectric layer comprising both high dielectric constant and low dielectric constant materials. Alternatively, this process may be reversed such that the low Er regions are applied first. Then a high Er material is used to fill in the surrounding areas. A representative low Er material is a polymer film such as polystyrene or polypropylene. Other types of low Er materials are polytetrafluoroethylene (a.k.a. Teflon or Gore-Tex) and air. Accordingly, air-filled voids could be used for the low Er regions, but due to possible manufacturing issues with such an approach it is preferable to use a low Er material having a visible physical structure. The manufacturing of the printed circuit board is then completed using traditional processes at 410, such as by drilling or etching interconnect vias in appropriate locations within the dielectric layer, and covering or coating this composite, coplanar dielectric layer with a second conductive layer, such as power plane 203 shown in FIG. 2, followed by a top substrate layer with an outer protective coating layer formed thereon. This printed circuit board may also have one or more embedded wiring planes (not shown), as is traditional in the art.

Figure 5:
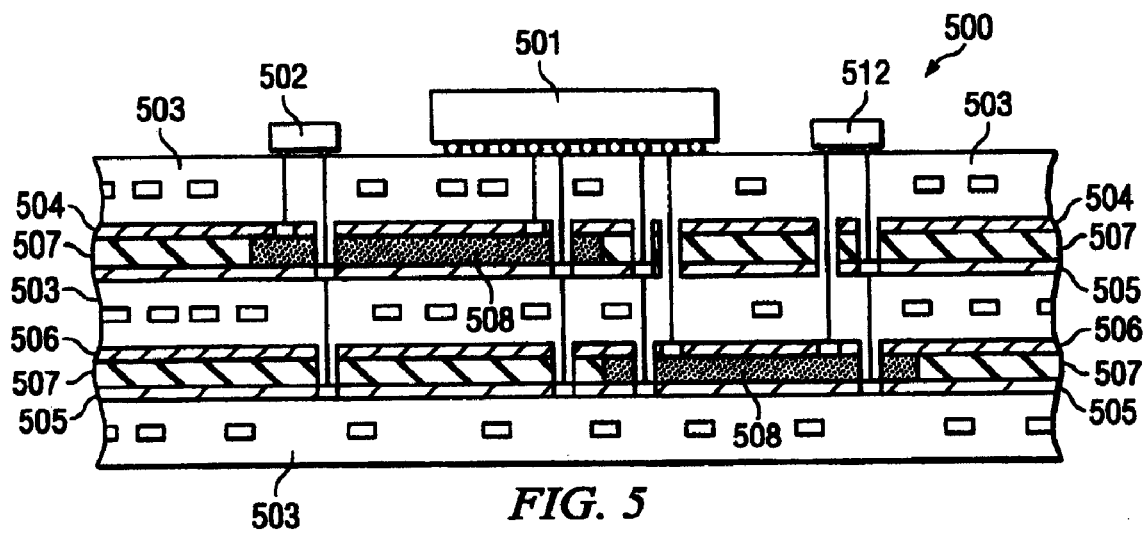
FIG. 5 depicts a side view of a new printed circuit board structure having a plurality of embedded dielectric layers per the present invention.

It is also possible to utilize the present technique of a dielectric layer having regions of dissimilar dielectric constant material in a board having a plurality of power-ground voltage planes, such as might exist in a system requiring a plurality of different supply voltages such as +3.5 volts, +5.0 volts, +12 volts, −12 volts, etc. Such a system is depicted in FIG. 5. The overall printed circuit board is shown at 500, and has mounted thereon an integrated circuit (IC) 501 and a plurality of discrete decoupling caps or capacitors 502 and 512. The signal or wiring layers are shown at 503, power layer #1 is shown at 504, ground layers are shown at 505 and power layer #2 is shown at 506. Regions 507 are high Er materials, and regions 508 are low Er materials. It should be noted that the ground layers 505 are tied together, and one pin of the IC 501 attaches to power layer #1 504 while another pin of the IC 501 attaches to power layer #2 506. The same applies to the decoupling caps, where one capacitor has a pin that attaches to power layer #1 504 and the other capacitor has a pin that attaches to power layer #2 506. The concept could also be applied to power planes of different voltages that are located within the same physical layer of the PCB (such as power layer #1 or power layer #2). It should also be noted that the embodiment shows blind vias (as they go to an internal layer and do not continue through to the other side of the card). Alternatively, through-hole vias could also be used, which do continue through to the other side of the card. This embodiment shown in FIG. 5 also depicts how the regions 508 of low Er materials do not necessarily have to be totally underneath the IC device 501, but rather are only partially underneath the IC device 501. This allows for two (or more) different low Er regions 508 to reside under a given IC device 501, with one associated with power layer #1 504 and the other associated with power layer #2 506. In this case, the low Er material resides under the appropriate power pin of the IC device 501 and extends to also reside under the decoupling capacitor(s) associated with that power pin/power layer, as shown in FIG. 5 by the two regions 508 of low Er materials—one 508 region associated with decoupling cap 502 and power layer #1 504, and the other 508 region associated with decoupling cap 512 and power layer #2 506.

Figure 6:
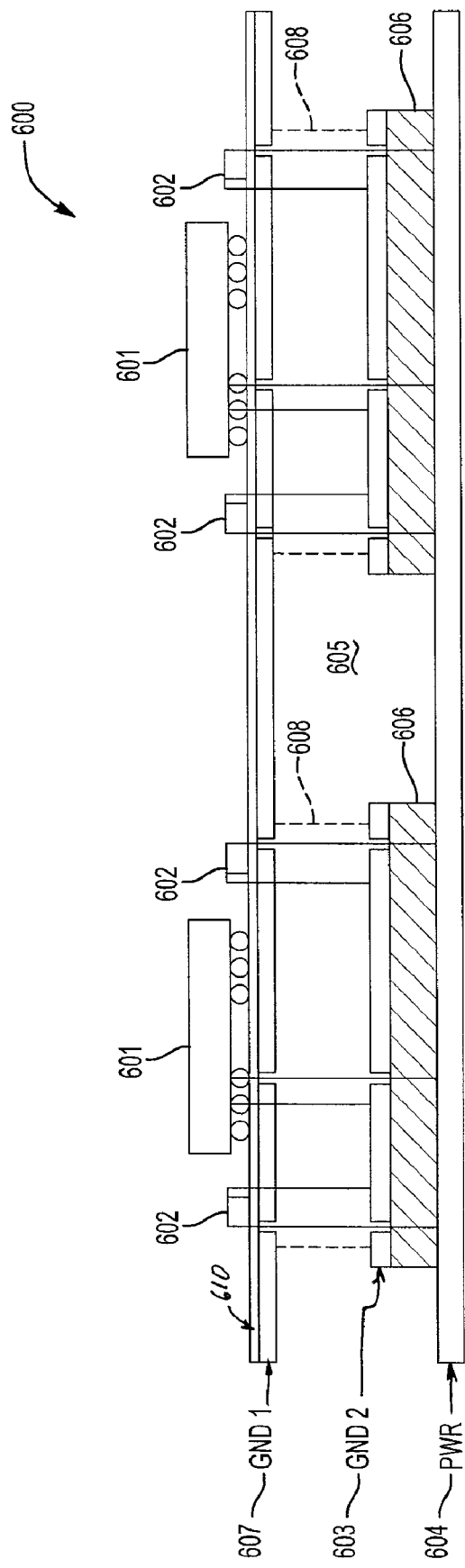
FIG. 6 depicts a side view of a new printed circuit board structure per the present invention.

FIG. 6 depicts a side view of a new printed circuit board structure 600 per the present invention. In the proposed implementation, the PCB manufacturer may start with a continuous layer of low Er dielectric material sandwiched between two conductive layers. This part of the structure may be known as the core, the components of which are labeled GND2 conducting layer 603, low Er material 606, and PWR conducting layer 604. An example of this type of core is DuPont's Interra product (Er=3). The core material goes through a process in which the GND2 conductive layer 603 as well as the low Er material 606 beneath it is removed in the areas that surround the IC decoupling regions associated with the integrated circuits and corresponding decoupling capacitors mounted on circuit board 610. These materials may be removed by laser ablation, chemical etching, or some other possible method.

The PWR conductive layer 604 may be left untouched during this ablation process. The next step may be to laminate another conductive layer (GND1) 607 to the GND2 603 side of the core with a thin layer of high Er material 605 between the two. During the lamination process, the high Er material 605 flows into the voids in the core. An example of high Er material is W. L. Gore's G510 Dielectric (Er=12.5). After the lamination process, micro-vias may be drilled to create a 'via fence' 608 which connects only GND1 and GND2, and surrounds each decoupling region. A spacing between micro-vias of 0.25" may be adequate to ensure that current has a low inductance path from GND1 to GND2. This GND-GND-PWR structure may make up the top-most and bottom-most layers of the PCB 600 to minimize the distance that charge must travel between decoupling capacitors and IC power pins. The structure of FIG. 6 provides a low Er, high velocity path for charge to propagate from decoupling capacitors to IC power pins, while also providing a high Er barrier to attenuate the propagation of noise to nearby circuits.

Power pins associated with the integrated circuits 601 may be electrically interconnected with the PWR conductive layer 604 and surrounded with low Er material 606 extending laterally outward to an outer portion generally corresponding with the related footprint 212. Separate low Er regions 606 may be associated with separate portions of the GND2 conducting layer 603 such that the two Er regions 606 are discontinuous. A portion of the high Er region 605 may extend between the two low Er regions 606 such that the high Er region 605 surrounds the low Er regions 606, i.e., it is coplanar and laterally adjacent thereto. The low Er regions 606 provide a high speed path for current to propagate between IC device 601 and decoupling capacitors 602 and the high Er material 605 provides a low speed path for power supply currents and bulk decoupling currents to propagate, thereby damping perturbations once they have propagated outside the low Er regions 606.

The GND2 conducting layer 603 may be sized and shaped to substantially correspond with the lateral extension of the two low Er portions 606. The electrical interconnect of the GND2 conducting layer 603 with the GND1 conducting layer 607 establishes a common electrical grounding potential between the two layers. The decoupling capacitors and integrated circuits may then be connected to the GND2 conducting layer and the PWR layer in order to provide a high speed path for charge to propagate between the decoupling capacitors and the integrated circuits 601. This takes advantage of the benefits of the high speed properties of the low Er material 606 while also taking advantage of the attenuation of the high Er material 605.

Thus, the present invention provides a new PCB structure that enables current to reach ICs in shorter time periods, while isolating high speed switching noise to individual IC decoupling regions.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

As required, detailed embodiments of the present invention are disclosed herein; however, it is to be understood that the disclosed embodiments are merely exemplary of the invention that may be embodied in various and alternative forms. The figures are not necessarily to scale, some features may be exaggerated or minimized to show details of particular components. Therefore, specific structural and functional details disclosed herein are not to be interpreted as limiting, but merely as a representative basis for the claims and/or as a representative basis for teaching one skilled in the art to variously employ the present invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. An electronic assembly, comprising:
   a circuit board;
   an integrated circuit attached to a top side of the printed circuit board;
   a plurality of decoupling capacitors connected to the top side of the printed circuit board around a perimeter of the integrated circuit, the plurality of decoupling capacitors providing charge current to the integrated circuit;
   a via fence surround the plurality of decoupling capacitors;
   a first ground layer disposed below a bottom side of the circuit board;
   a power layer disposed below the first ground layer;
   a second ground layer disposed between the first ground layer and the power layer, the second ground layer extends widthwise between the via fence;

the circuit board including an inner dielectric layer comprising (i) a first material having a dielectric constant of approximately 12.5, and (ii) a second material having a dielectric constant of approximately 3;

the second material extending heightwise between a bottom side of the second ground layer and a top side of the power layer and widthwise between the via fence; and the first material surrounding the second material, the first material forming at least a volume extending heightwise between the first ground layer and the second ground layer and widthwise between the via fence.

2. The electronic assembly of claim 1 wherein at least a portion of the first material is coplanar and laterally adjacent to the second material.

3. The electronic assembly of claim 1 wherein the via fence electrical interconnect of the first and second ground layers at the same electric potential.

4. An electronic assembly comprising:
a first ground layer comprising an electrically conductive material;
a second ground layer comprising the electrically conductive material;
a power layer comprising the electrically conductive material;
a first integrated circuit mounted on a top surface above the first ground layer having at least one pin electrically connected to the power layer and at least one pin electrically connected to the second ground layer, the at least one pin electrically connected to the second ground layer defining a first power node;
at least a first decoupling capacitor mounted on the top surface with the first integrated circuit, the at least the first decoupling capacitor having at least one pin connected to the power layer and at least one pin electrically connected to the second ground layer, the at least one pin connected to the power layer defining a second power node and providing charge current to the first integrated circuit;
a dielectric layer having at least two separate regions, with a first region consisting of a higher dielectric material than a second region consisting of a lower dielectric material, a dielectric differential between the higher and lower dielectrics being greater than 1;
wherein the second region is approximately equal to a length of the second ground layer and disposed between the second ground layer and the power layer such that the lower dielectric material is disposed between the first and second power nodes; and
wherein the first region consisting of the higher dielectric material is disposed between the second ground layer and the first ground layer and around the second region and the second ground layer.

5. The system of claim 4 wherein the higher dielectric material is one of barium titanate, tantalum oxide, aluminum oxide, alumina, borosilicate and mica.

6. The system of claim 4 wherein the lower dielectric material is a polymer film.

7. The system of claim 4 wherein the length of the second ground layer and the lower dielectric material is approximately equal to a length extending widthwise across a footprint of the integrated circuit and each of the at least one decoupling capacitors.

8. The of claim 4 further comprising:
a third ground layer comprising the electrically conducting material being independent from and coplanar and laterally adjacent with the second ground layer;

a via fence forming separate connections between the first ground layer and each of the second and third ground layers such that the each of the first, second, and third ground layers are electrically but not physically interconnected to share the same electrical potential;

a second integrated circuit mounted on a top surface above the first ground layer having at least one pin electrically connected to the power layer and at least one pin electrically connected to the third ground layer to define a third power node;

at least one second decoupling capacitor mounted on the top surface with the second integrated circuit, the at least one second decoupling capacitor having at least one pin connected to the power layer and at least one pin electrically connected to the third ground layer, the at least one second decoupling capacitor defining a fourth power node and providing charge current to the second integrated circuit;

wherein the dielectric layer includes a third region consisting of lower dielectric material that is independent from and coplanar and laterally adjacent with the second region;

wherein the third region consisting of the low dielectric region is approximately equal to a length of the third ground layer and disposed between the third ground layer and the power layer such that lower dielectric material is disposed between the third and fourth power nodes;

wherein the first region consisting of the high dielectric region is disposed between the third ground layer and the first ground layer and around opposed sides of both of the third region and the third ground layer; and a second plurality of signal traces offset between the first and third conducting layers to define signal paths, the higher dielectric material of the first region covering the second plurality of signal paths.

9. An electronic assembly comprising:
an integrated circuit (IC) device connected to a ground plane and a power plane, the IC device characterized as having an outer peripheral that defines an IC footprint, the IC footprint defining a first area approximately equal to a length of the IC device times a width of the IC device;

a plurality of decoupling capacitors laterally adjacent to the IC device, the plurality of decoupling capacitors connected between the ground plane and the power plane to supply charge current to the IC device, the plurality of decoupling capacitors being disposed around the IC device to define a second area approximately equal to the first area plus additional area around the first area sufficient to encompass the IC footprint and the decoupling capacitors;

wherein the ground plane is comprised of planar first and second conducting layers, the first conducting layer being parallel to the second conducting layer, the first conducting layer being offset a first distance above the second conducting layer, the first conducting layer having a third area that aligns with and is larger than the second area, the second conducting layer having a fourth area that aligns with and is approximately equal to the second area;

wherein the power plane is comprised of a planar third conducting layer, the third conducting layer being parallel to the first and second conducting layers and offset a third distance below the second conducting layer, the third conducting layer having a fifth area that aligns with and is at least as large as the first conducting layer;

a low Er dielectric layer laminated to each of a top side of the third conducting layer and a bottom side of the second conducting layer, the low Er dielectric layer filling a first volume between the second conducting layer and the third conducting layer with low Er material, wherein a side of the first volume of the low Er material is defined as extending from the second conducting to the third conducting layer;

a high Er dielectric layer laminated to each of the top side of the third conducting layer, a top side of the second conducting layer, a bottom side of the first conducting material, and the side of the first volume of the low Er material, the high Er dielectric layer filling an second volume between the first conducting layer and the third conducting layer with high Er material;

the low dielectric layer having a dielectric constant of at least 1;

the high dielectric layer having a dielectric constant greater than one times the dielectric constant of the low dielectric layer.

10. The assembly of claim 9 further comprising a via fence for electrical interconnect of the second and first conducting layers such that the second and first conductive layers have the same electric potential.

11. The assembly of claim 9 wherein the dielectric constant of the low Er material is approximately k=3 and the high Er material is approximately k=12.5.

12. The assembly of claim 9 wherein the dielectric constant of the low Er material is approximate k<3 and the high Er material is approximately k>3.

13. The assembly of claim 9 wherein the low Er material has a value of 1<k<3 and the high Er material has a value of 3<k<7.

14. The assembly of claim 9 further comprising signal traces offset between the first and second conducting layers to define signal paths through the high Er dielectric layer and not the low Er dielectric layer.

* * * * *